(12) United States Patent
Kagami

(10) Patent No.: US 7,583,099 B2
(45) Date of Patent: Sep. 1, 2009

(54) METHOD FOR RE-REGISTERING AN OBJECT TO BE ALIGNED BY RE-CAPTURING IMAGES USING PREVIOUSLY REGISTERED CONDITIONS AND STORAGE MEDIUM STORING A PROGRAM FOR EXECUTING THE METHOD

(75) Inventor: Fumito Kagami, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/857,912

(22) Filed: Sep. 19, 2007

(65) Prior Publication Data

US 2008/0068033 A1 Mar. 20, 2008

(30) Foreign Application Priority Data

Sep. 19, 2006 (JP) .............................. 2006-253247

(51) Int. Cl.
G01R 31/00 (2006.01)
(52) U.S. Cl. ...................................................... 324/758
(58) Field of Classification Search ........................ None
See application file for complete search history.

(56) References Cited

U.S. PATENT DOCUMENTS

| 5,644,245 | A | * | 7/1997 | Saitoh et al. | ................. | 324/754 |
| 6,002,426 | A | * | 12/1999 | Back et al. | ..................... | 348/87 |
| 6,762,612 | B2 | * | 7/2004 | Yu et al. | ..................... | 324/757 |

FOREIGN PATENT DOCUMENTS

| JP | 2002-151555 | 5/2002 |
| KR | 10-1999-0062690 | 7/1999 |

* cited by examiner

*Primary Examiner*—Vinh P Nguyen
(74) *Attorney, Agent, or Firm*—Oblon, Spivak, McClelland, Maier & Neustadt, P.C.

(57) ABSTRACT

A method for re-registering at least one set of image information of an object to be aligned to align the object by an imaging unit, the image information including photographing conditions and position data of the object which have been previously registered by capturing an image of the object with the imaging unit. The method includes automatically moving at least one of the object and the imaging unit based on the position data of the image information and re-capture the image of the object with the imaging unit by using the previously registered photographing conditions of the image information and re-registering the image information by using the re-captured image of the object.

5 Claims, 6 Drawing Sheets

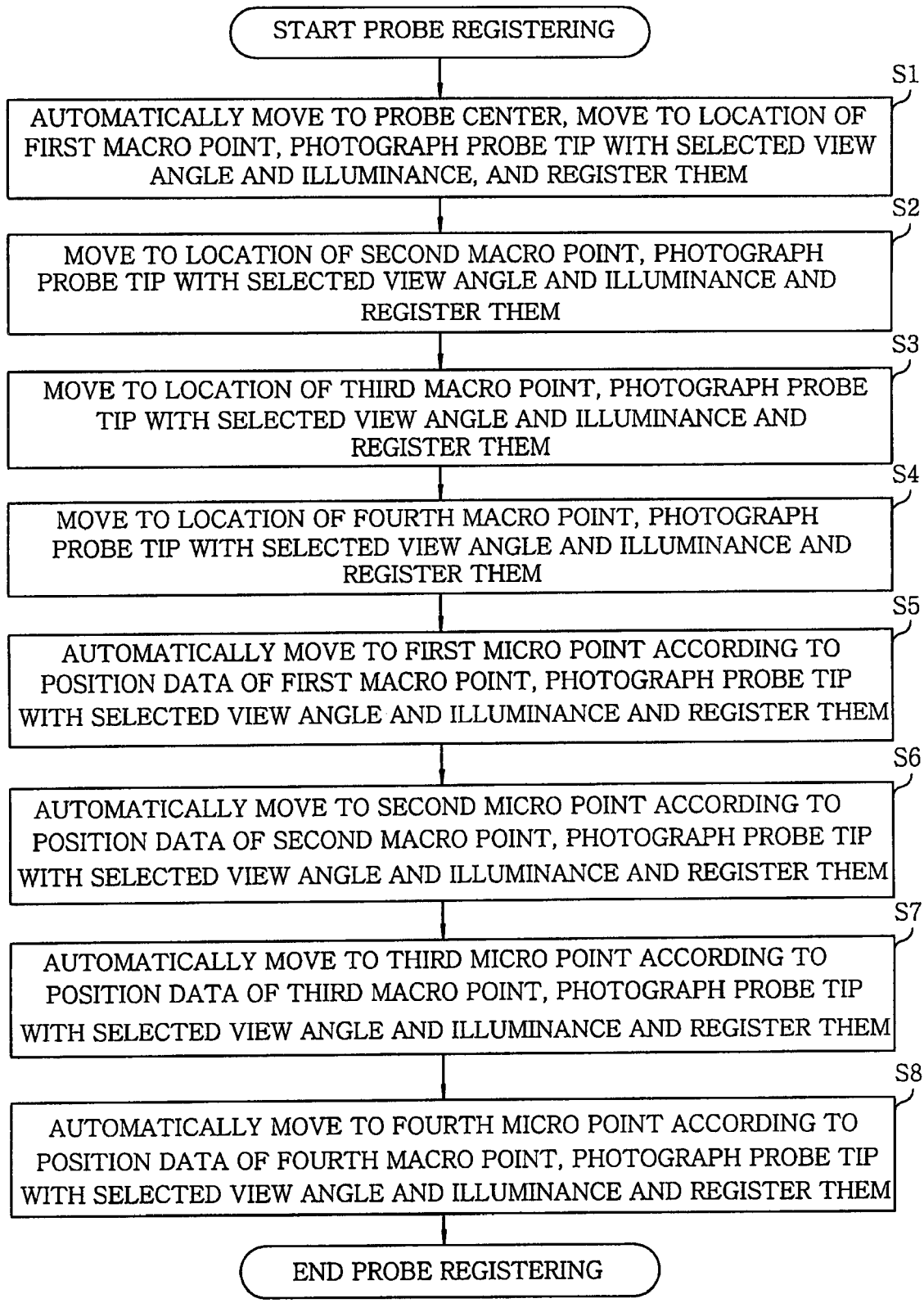

METHOD FOR RE-REGISTERING AN OBJECT TO BE ALIGNED BY RE-CAPTURING IMAGES USING PREVIOUSLY REGISTERED CONDITIONS AND STORAGE MEDIUM STORING A PROGRAM FOR EXECUTING THE METHOD

FIELD OF THE INVENTION

The present invention relates to a method for re-registering an object to be aligned and a storage medium storing a program for executing the method; and, more particularly, to a method for re-registering an object to be aligned, e.g., a specific probe or test electrode of an object to be inspected such as a wafer or the like, by capturing an image thereof with an imaging unit before inspecting the object to be inspected by electrically contacting the probe and the object to be inspected, and a storage medium storing a program for executing the method.

BACKGROUND OF THE INVENTION

A process for manufacturing semiconductor devices from a wafer includes various processing steps, and each of the processing steps is performed on the wafer mounted on a mounting table. An alignment operation for precisely positioning the wafer is often performed prior to a specific processing step to be performed on the wafer.

In case a wafer is inspected by an inspection apparatus shown in FIG. 5 for example, the alignment between a plurality of test electrodes of each device of the wafer and probes corresponding thereto is performed before the inspection is carried out by allowing electrical contact between the test electrodes and the corresponding probes. As illustrated in FIGS. 5A and 5B, the inspection apparatus includes a loader chamber 1 for loading and unloading of a wafer W; and a prober chamber 2 for inspecting electrical characteristics of the wafer W. The loader chamber 1 has a transfer arm 3 for transferring a wafer W in a cassette C to the prober chamber 2; and a pre-alignment mechanism 4 for performing a pre-alignment of the wafer W while the wafer W is being transferred by the transfer arm 3.

The prober chamber 2 has a mounting table 5 for mounting thereon the pre-aligned wafer W, the mounting table 5 being movable in X, Y, Z and θ directions; a probe card 6 disposed above the mounting table 5; and an alignment mechanism 7 for performing an alignment between a plurality of probes 6A of the probe card 6 and the wafer W on the mounting table 5. The probe chamber 2 is operated under the control of a controller (not shown). Further, the probe card 6 is fixed at an opening of a head plate 8. A test head T is provided on top of the head plate 8, and the probe card 6 is electrically connected with a tester (not illustrated) via the head plate 8.

The pre-alignment mechanism 4 has a rotatable table 4A for mounting thereon the wafer W; and an optical detection unit (not shown) for optically detecting orientation flats and notches formed around an outer periphery of the wafer W. While the rotatable table 4A having thereon the wafer W is rotating, the optical detection unit detects the orientation flats and the notches of the wafer W, thereby pre-aligning the wafer in a specific direction.

As depicted in FIGS. 5A and 5B, the alignment mechanism 7 has a first CCD camera 7A, attached to the side of the mounting table 5, for capturing images of the probes 6A; a second CCD camera 7B for capturing images of the wafer W; and an alignment bridge 7C for supporting the second CCD camera 7B; and a pair of guide rails 7D for guiding the alignment bridge 7C to a probe center. The first CCD camera 7A captures the images of the probes 6A, and the second CCD camera 7B captures the images of the test electrodes of the wafer W. Next, the probes 6A and the test electrodes are aligned based on the image position data.

Meanwhile, prior to the alignment between the probes 6A and the wafer W, position data and the like which are obtained by capturing images of tips of specific probe 6A and a test electrodes of the wafer W by using the first and the second CCD camera 7A and 7B needs to be are registered. The registration is carried out by using the captured images of the probes 6A and the wafer W which are displayed on multi-windows of a display screen 9 of a display unit and a manipulation panel adjacent thereto. For example, the position data of the probes 6A positioned in four corners of the probe card 6 are registered according to the sequence shown in FIG. 6 by using the captured images displayed on the display screen 9 and the manipulation panel. To do so, positions of the probe 6A are detected first by photographing the probe card 6 at a low magnification with the first CCD camera 7A. Next, images of the tips of the probes 6A are captured at a high magnification. The obtained data is registered for alignment process.

First of all, the mounting table 5 automatically moves so that the first CCD camera 7A can be positioned at the probe center (center of the probe card 6) under the control of the controller. Next, the first CCD camera 7A captures an image of the probe card 6 at a low magnification from the probe 6A side. The captured image is displayed on the display screen 9 so that an overall state of the probe card 6 can be monitored. Then, the manipulation panel is manipulated to move the mounting table 5 from the probe center to a specific probe 6A while monitoring the captured image displayed on the display screen 9. When a focus of the first CCD camera 7A is aligned with a needle-tip of the probe 6A, view and illuminance of the first CCD camera 7A (hereinafter, referred to as "photographing conditions") are selected. The selected photographing conditions and position data of the mounting table 5 obtained at this time are registered as first image information of a first macro node (step S1).

Next, the manipulation panel is manipulated to move the mounting table 5 in the same manner. When the first CCD camera 7A is focused on the tip of another probe 6A different from the probe 6A of the first macro node, photographing conditions are selected. The selected photographic conditions and position data of the mounting table 5 obtained at this time are registered as first image information of a second macro point (step S2).

Next, the first CCD camera 7A moves to still another probe 6A by the mounting table 5; In the same manner, photographing conditions and position data of the tip of the corresponding probe 6A are registered as first image information of a third macro point (step S3). Thereafter, photographing conditions and position data of the tip of a next probe 6A are registered in the same manner described above as first image information of a fourth macro point (step S4).

As described above, the images of the four probes 6A are captured as the first to the fourth macro point at a low magnification and the first image information of the first to the fourth macro point are registered. Thereafter, the first CCD camera 7A is switched to a high magnification employed in alignment. Then the first CCD camera 7A automatically moves by the mounting table 5 based on the position data of the first macro point. After the first CCD camera 7A is focused on the tip of the probe 6A corresponding to the first macro point, the photographing conditions at this time are selected as those for a first micro point. The selected photographing conditions and the position data obtained at this time are registered as second image information of the first micro point (step S5).

Thereafter, the first CCD camera 7A automatically moves by the mounting table 5 based on the position data of the second macro point. When the first CCD camera 7A is focused on the tip of the probe 6A corresponding to the second macro point, the photographing conditions at this time are selected as those for a second micro point. The selected photographing conditions and the position data obtained at this time are registered as second image information of the second micro point (step S6).

Next, the mounting table 5 automatically moves to the third macro point, and the probe 6A is photographed as a third micro point by the first CCD camera 7A. The photographing conditions and the position data obtained at this time are registered as the second image information of the third macro node (step S7). Then, the mounting table 5 automatically moves to the fourth macro point, and the probe 6A is photographed as the fourth micro point by the first CCD camera 7A. The photographing conditions and the position data obtained at this time are registered as second image information of the fourth micro point (step S8). A series of the probe registration operation is completed in this way, and the data obtained therefrom is provided for the alignment with the wafer W.

Further, photographing conditions and position data for multiple locations of the wafer W are also registered in a same manner as in the case of the probe 6A. Then, the probes 6A and the wafer W are aligned by using the registered data. Thereafter, electrical characteristics of a plurality of devices formed on the wafer W are inspected while index-feeding the wafer W.

While the electrical characteristic inspection is repeatedly performed on the same wafers W, the probe card 6 that has been used may be replaced with another probe card 6 of a different kind. In that case, even if the probe card 6 is functionally substantially identical to the old one, probes 6A of the new probe card 6 may have shapes different from those of the old one since the old and new probe cards are of different kinds. Thus, the probe 6A of the new probe card 6 may have images different from those of the old probe card 6 and the changed captured images may not be unrecognized by a computer. Accordingly, the new probe card 6 needs to be re-registered. The re-registration operation is also required when the probe card 6 has been contaminated. In order to perform the re-registration operation by using the conventional method, the entire processes described in FIG. 6 need to be performed, which requires a long period of time. Further, in case a pre-treatment performed on a wafer W has changed for example, re-registration needs to be performed with respect to the wafer W even though the wafer W remains substantially unchanged and a long period of time is required for the re-registration operation.

SUMMARY OF THE INVENTION

In view of the foregoing, the present invention provides a method for re-registering an object to be aligned and a storage medium storing a program for executing the method, the method being capable of quickly re-registering a captured image of an object to be inspected which is substantially identical but of a different kind, even though the captured image has changed due to the difference in kind.

In accordance with one aspect of the invention, there is provided a method for re-registering at least one set of image information of an object to be aligned to align the object by an imaging unit, the image information including photographing conditions and position data of the object which have been previously registered by capturing an image of the object with the imaging unit, the method including: automatically moving at least one of the object and the imaging unit based on the position data of the image information and re-capture the image of the object with the imaging unit by using the previously registered photographing conditions of the image information; and re-registering the image information by using the re-captured image of the object.

In accordance with another aspect of the invention, there is provided a method for re-registering at least one set of first and at least one set of second image information of an object to be aligned to thereby align the object by an imaging unit, the first and second image information respectively including photographing conditions and position data of the object which have been previously registered by capturing an image of the object at a low and a high magnification with the imaging unit, the method including: automatically moving at least one of the object and the imaging unit based on the position data of the first image information and re-capture the image of the object at the low magnification with the imaging unit by using the previously registered photographing conditions of the first image information;

re-registering the first image information by using the image of the object re-captured at the low magnification;

automatically moving at least one of the object and the imaging unit based on the position data of the first image information and re-capture the image of the object at the high magnification with the imaging unit by using the previously registered photographing conditions of the second image information; and re-registering the second image information by using the image of the object re-captured at the high magnification.

Preferably, if an alignment error occurs while aligning the object, currently captured image of the object and a registered image corresponding thereto are simultaneously displayed on a display screen.

Preferably, at least one of the object and the imaging unit is manipulated to move toward alignment marks displayed on the currently captured image and the registered image corresponding thereto.

Preferably, the object is a probe card or an object to be inspected.

In accordance with further aspect of the invention, there is provided a storage medium for storing therein a computer-executable program for executing a method for re-registering at least one set of image information of an object to be aligned to align the object by an imaging unit, the image information including photographing conditions and position data of the object which have been previously registered by capturing an image of the object with the imaging unit, the method including: automatically moving at least one of the object and the imaging unit based on the position data of the image information and re-capture the image of the object with the imaging unit by using the previously registered photographing conditions of the image information; and re-registering the image information by using the re-captured image of the object.

In accordance with still further aspect of the invention, there is provided a storage medium for storing therein a computer-executable program for executing a method for re-registering at least one set of first and at least one set of second image information of an object to be aligned to align the object by an imaging unit, the image information including photographing conditions and position data of the object which have been previously registered by capturing an image of the object at a low and a high magnification with the imaging unit, the method including: automatically moving at least one of the object and the imaging unit based on the position data of the first image information and re-capture the image of the object at the low magnification with the imaging unit by using the previously registered photographing conditions of the image information; re-registering the first image information by using the re-captured image of the object; automatically moving at least one of the object and the imaging unit based on the position data of the first image information and re-capture the image of the object at the high magnification with the imaging unit by using the previously registered photographing conditions of the image information; and re-registering the second image information by using the re-captured image of the object.

In accordance with the aspects of the present invention, there are provided a method for re-registering an object to be aligned and a storage medium storing a program for executing the method, the method being capable of quickly re-registering a captured image of an object to be inspected which is substantially identical but of a different kind, even though the captured image has changed due to the difference in kind.

BRIEF DESCRIPTION OF THE DRAWINGS

The objects and features of the present invention will become apparent from the following description of embodiments, given in conjunction with the accompanying drawings, in which:

FIGS. 5A and 5B depict an exemplary of the inspection apparatus, wherein FIG. 5A shows partial cutaway front view and FIG. 5B is a top view illustrating the interior of the inspection apparatus; and FIG. 6 provides a flow chart of a probe registration operation.

DETAILED DESCRIPTION OF THE EMBODIMENT

Hereinafter, embodiments of the present invention will be described with respect to FIGS. 1 to 4 which forms a part hereof.

Figure 1:
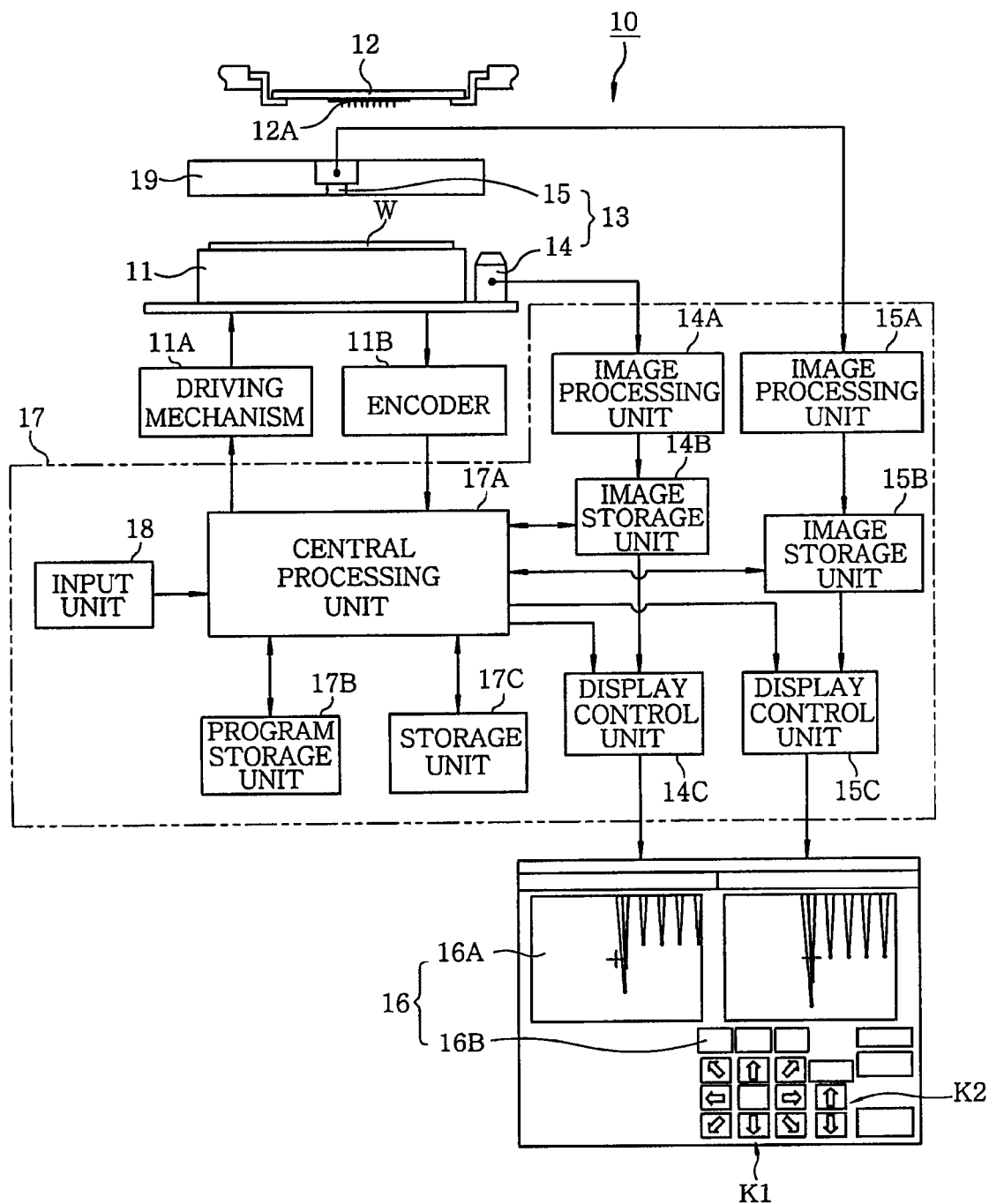
FIG. 1 is a block diagram showing a configuration of an inspection apparatus implementing an embodiment of the method of the present invention.

First, there will be described an inspection apparatus having a storage medium for storing therein a program for executing a method for re-registering an object to be aligned. As illustrated in FIG. 1, an inspection apparatus 10 includes a movable mounting table 11 for mounting thereon a wafer W serving as an object to be inspected; a probe card 12 provided above the mounting table 11; an alignment mechanism 13 for performing an alignment between a plurality of probes 12A of the probe card 12 and the wafer W on the mounting table 11; a first and a second imaging units (e.g., a first and a second CCD camera 14 and 15) constituting the alignment mechanism 13; a display unit having a display screen 16 for displaying thereon images captured by the first and the second CCD camera 14 and 15; and a controller 17 formed of a computer for controlling the above described parts. The inspection apparatus is configured to inspect the electrical characteristics of the wafer W by electrically contacting the probes 12A and the wafer W after performing the alignment between the wafer W on the mounting table 11 and the probes 12A of the probe card 12 by using the alignment mechanism 13 under the control of the controller 17.

The inspection apparatus 10 further includes an input unit 18 such as a keyboard or the like, as shown in FIG. 1. The input unit 18 enables various inspection conditions to be inputted and also specifies a menu or icons (not shown) displayed on the display screen 16 so that various programs can be executed.

As shown in FIG. 1, the mounting table 11 has a driving mechanism 11A and a detector (e.g., an encoder 11B). The mounting table 11 is configured to move in X, Y, Z and θ directions via the driving mechanism 11A and detect a moving amount via the encoder 11B. The driving mechanism 11A has a horizontal driving mechanism (not shown) for driving an XY table on which the mounting table 11 is disposed, the horizontal driving mechanism being mainly formed of, e.g., a motor and a ball screw; an elevation driving mechanism installed inside the mounting table 11; and a θ driving mechanism for rotating the mounting table 11 in a θ direction. The encoder 11B detects moving distances of the XY table in X and Y directions by the number of revolutions of the motor and transmits the detected signals to the controller 17. The controller 17 controls the driving mechanism 11A based on the signals from the encoder 11B, thereby controlling the moving amount of the mounting table 11 in X and Y directions.

As described above, the alignment mechanism 13 has the first and the second CCD camera 14 and 15 and the alignment bridge 19. As illustrated in FIG. 1, the first CCD camera 14 is installed at the side of the mounting table 11, and the second CCD camera 15 is installed at the alignment bridge 19. The first and the second CCD camera 14 and 15 respectively capture images of the probes 12A and the wafer W at one of a low magnification and a high magnification.

After the alignment bridge 19 moves to a rear part of the probe chamber, the first CCD camera 14 captures, from the below the probe card 12, images of tips of the probes 12A at a specific magnification while the mounting table 11 is moving in the X and Y directions under the probe card 12. The image signals are transmitted to the controller 17, so that the captured images of the probes are displayed on the display screen 16 via the controller 17. The second CCD camera 15 moves from the rear part of the probe chamber to the probe center via the alignment bridge 19 and thus is positioned between the probe card 12 and the mounting table 11. While the mounting table 11 is moving in X and Y directions, the second CCD camera 15 positioned at the probe center captures, from the top, images of the wafer W at a specific magnification and transmits the signals respectively the captured images to the controller 17. The captured wafer images are displayed on the display screen 16 via the controller 17.

The controller 17 has a central processing unit 17A; a program storage unit 17B for storing therein various programs including a program for executing a method for re-registering an object to be aligned; a storage unit 17C for storing therein various data; image processing units 14A and 15A for processing the image signals from the first and the second CCD camera 14 and 15; image storage units 14B and 15B for storing therein as image data the image signals from the image processing units 14A and 15A; and display control units 14C and 15C for displaying the captured images on the display screen 16 based on the image signals. Signals are transmitted between the central processing unit 17A, the program storage unit 17B and the storage unit 17C, so that various parts of the inspection apparatus 10 can be controlled.

The central processing unit 17A is connected with the input unit 18. Therefore, various data signals inputted from the input unit 18 are processed by the central processing unit 17A and then stored in the storage unit 17C. In this embodiment, a program for executing a method for re-registering an object to be aligned is stored in the program storage unit 17B. Further, the display screen 16 displays thereon a captured image 16A, a manipulation panel 16B and the like. As will be described later, the manipulation panel 16B is manipulated to move the first and the second CCD camera 14 and 15 prior to the alignment or to register the image information such as the position data of the probe card 12 and the like. The first and the second CCD camera 14 and 15 are configured to move in the X and Y directions by pressing horizontal movement manipulation keys K1 of the manipulation panel 16B and in Z direction by pressing vertical movement manipulation keys K2 of the manipulation panel 16B.

Further, the central processing unit 17A is connected with the image storage units 14B and 15B and the display control units 14C and 15C. The images captured by the first and the second CCD camera 14 and 15 are displayed on the display screen 16 via the central processing unit 17A and the display control units 14C and 15C. The image storage units 14B and 15B can store therein previously captured images, synthetic images or the like in addition to the currently captured images from the first and the second CCD camera 14 and 15.

Programs for implementing the method of the present invention which re-registers an object to be aligned, and the like are stored in the program storage unit 17B via various storage mediums. However, these programs can be downloaded to various inspection apparatuses by communication media. In this embodiment, the program executed for implementing the method for re-registering an object to be aligned is stored in the program storage unit 17B.

Hereinafter, an embodiment of the method of the present invention which re-registers an object to be aligned will be described with reference to FIG. 2. The object to be aligned is re-registered when captured images of the object have changed in a state where the pre-registered wafer W or the probe card 12 is substantially same as the object. That is, shapes of probes 12A may be different depending on kinds of the probe cards even if the probe cards are substantially identical. Thus, captured images thereof are changed and can not be unrecognized by on a computer. In such a case, the method of the present invention which re-registers an object to be aligned enables the changed captured image to be re-registered in a short period of time by using previously registered image information including position data and photographing conditions. In this embodiment, there will be described a method for re-registering the probes 12A of the probe card 12. The probes 12A and the wafer W serve as objects to be aligned in this embodiment.

First, the program for executing the method for re-registering an object to be aligned is selected on the display screen 16 by manipulating the horizontal movement manipulation keys K1 and the vertical movement manipulation keys K2. The selected program is executed via the controller 17 according to the sequence shown in FIG. 2. To be specific, as described in FIG. 2, the first CCD camera 14 in the probe chamber automatically moves to the first macro point by the mounting table 11 by using the position data of the first image information of the first macro point which has been previously registered by the probe registration operation described in FIG. 6. Further, the first CCD camera 14 captures an image of a tip of the probe 12A corresponding to the first macro point at the low magnification by automatically reflecting the previously registered photographing conditions (view angle and illuminance) of the first image information of the first macro point.

Then, the captured image is automatically registered, as a registered image of the first macro point, in the image storage unit 14B (step S11). It is possible to reuse the position data and the photographing conditions of the previously registered image information without modification because the position data of the tip of the probe 12A is not changed even if the probe card 12 is replaced with another probe card of a different kind. Therefore, when the tip of the probe 12A corresponding to the first macro point is re-registered, the previous position data and photographing conditions of the first macro point can be reused without newly setting the position data and the photographing conditions. As a result, the time required for performing the re-registration operation can be considerably reduced.

Figure 2:
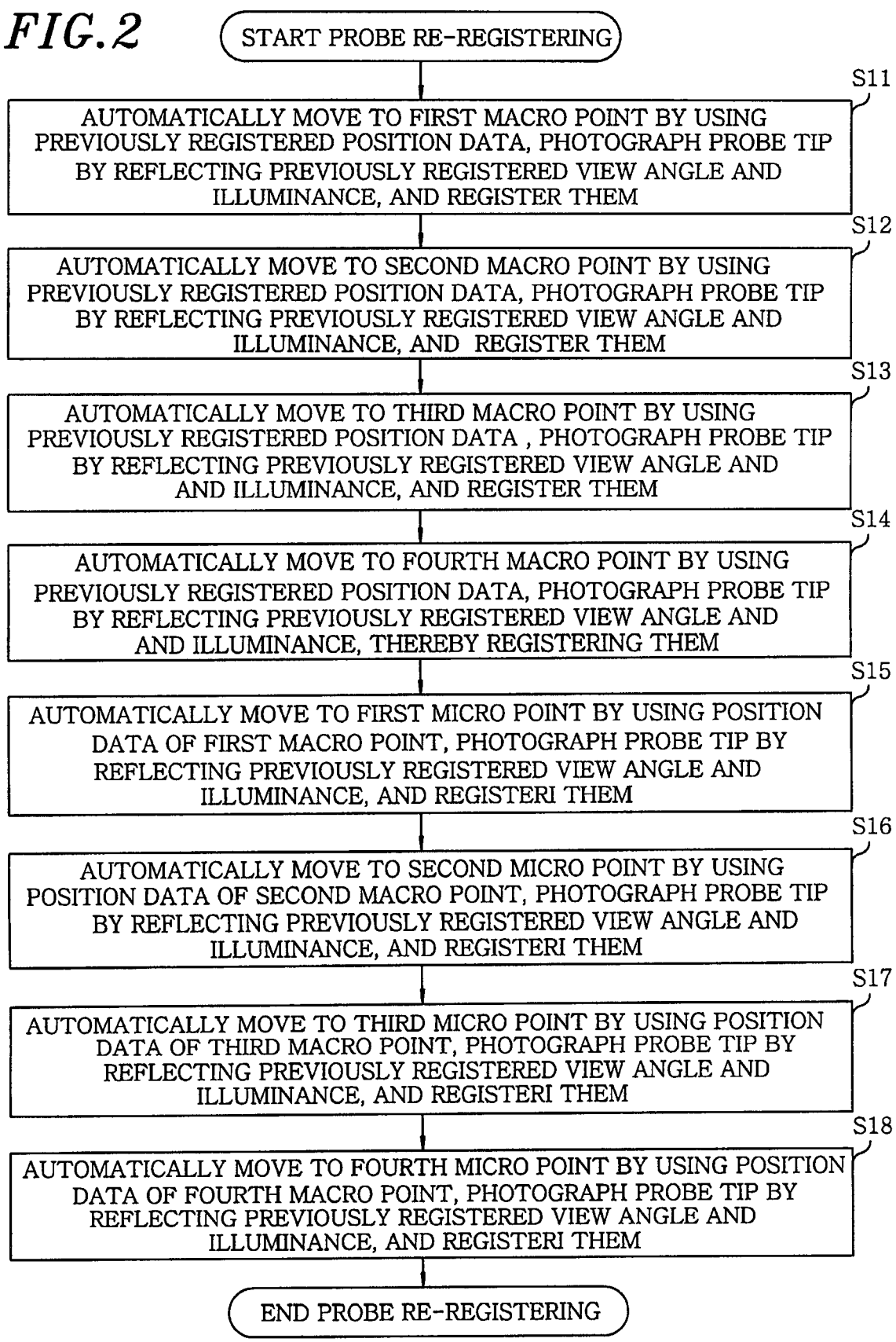
FIG. 2 describes a flow chart depicting a probe re-registration operation in accordance with the embodiment of the method of the present invention.

Next, as shown in FIG. 2, the first CCD camera 14 automatically moves to the second macro point by the mounting table 11 under the control of the controller 17 by using the previous position data of the second macro point of the first image information. Further, the first CCD camera 14 captures an image of a tip of the probe 12A corresponding to the second macro point at the low magnification by automatically reflecting the previously registered photographing conditions (view angle and illuminance) of the first image information of the second macro point. Then, the captured image is automatically registered, as a registered image of the second macro point, in the image storage unit 14B (step S12).

Thereafter, the first CCD camera 14 automatically moves to the third macro point by the mounting table 11 by using the previously registered position data of the third macro point of the first image information. Moreover, the first CCD camera 14 captures an image of a tip of the probe 12A corresponding to the third macro point at the low magnification by reflecting the previously registered photographing conditions of the first image information. Then, the captured image is automatically registered, as a registered image of the third macro point, in the image storage unit 14B (step S13).

Thereafter, the first CCD camera 14 automatically moves to the fourth macro point by the mounting table 11 by using the previously registered position data of the fourth macro point of the first image information. Further, the first CCD camera 14 captures an image of a tip of the probe 12A corresponding to the fourth macro point at the low magnification by reflecting the previously registered photographing conditions of the first image information. Next, the captured image is automatically registered, as a registered image of the fourth macro point, in the image storage unit 14B (step S14).

After the tips of the probes 12A positioned at the four corners of the probe card 12 are re-registered by capturing images thereof at the low magnification with the first CCD camera 14, the tips of the probes 12A are re-registered by capturing images thereof at the high magnification with the first CCD camera 14, as will be described below.

As illustrated in FIG. 2, the first CCD camera 14 automatically moves to the first micro point by the mounting table 11 by using the position data of the first macro point which has been re-registered in the step S11. Further, the first CCD camera 14 captures an image of the tip of the probe 12A corresponding to the first micro point at the high magnification by automatically reflecting the previously registered photographing conditions (view angle and illuminance) of the second image information of the first micro point. Then, the captured image is automatically registered, as a registered image of the first micro point, in the image storage unit 14B (step S15). Since it is possible to reuse the position data that has been re-registered in the step S11 and the previously registered photographing conditions of the second image information with modification, the captured image of the first micro point can be re-registered without newly setting the position data and the photographing conditions. As a consequence, the time required for executing the re-registration operation can be considerably reduced.

Next, the first CCD camera 14 automatically moves to the second micro point by the mounting table 11 by using the position data of the first macro point which has been re-registered in the step S12. Further, the first CCD camera 14 captures an image of the tip of the probe 12A corresponding to the second micro point at the high magnification by automatically reflecting the previously registered photographing conditions of the second image information of the second micro point. Then, the captured image is automatically registered, as a registered image of the second macro node, in the image storage unit 14B (step S16).

Thereafter, the first CCD camera 14 automatically moves to the third micro point by the mounting table 11 by using the position data of the third macro point which has been re-registered in the step S13. Further, the first CCD camera 14 captures an image of the tip of the probe 12A corresponding to the third micro point at the high magnification by automatically reflecting the previously registered photographing conditions of the second image information of the third micro point. Then, the captured image is automatically registered, as a registered image of the third micro point, in the image storage unit 14B (step S17).

Next, the first CCD camera 14 automatically moves to the fourth micro point by the mounting table 11 by using the position data of the fourth macro point which has been re-registered in the step S14. Further, the first CCD camera 14 captures an image of the tip of the probe 12A corresponding to the fourth micro point at a high magnification by automatically reflecting the previously registered photographing conditions of the second image information of the fourth micro point. Then, the captured image is automatically registered, as a registered image of the fourth micro point, in the image storage unit 14B (step S18). In this manner, a series of the re-registration operation is completed. Since an operator needs to check only the operation of the first CCD camera 14 during the series of the re-registration operations, the re-registration operations can be completed in a short period of time.

Upon the completion of the re-registration of the probe card 12, the alignment between the probe card 12 and the wafer W is performed to inspect the electrical characteristics of the wafer W. The alignment operation is preformed on a wafer basis. When the probes 12A for the alignment are misaligned by a certain factor during the repetitive alignment operations, an alignment assist function is executed to stop the alignment operation. In this embodiment, the assist supplement function is added to solve the error and, hence, the alignment operation can resume shortly.

Figure 3:
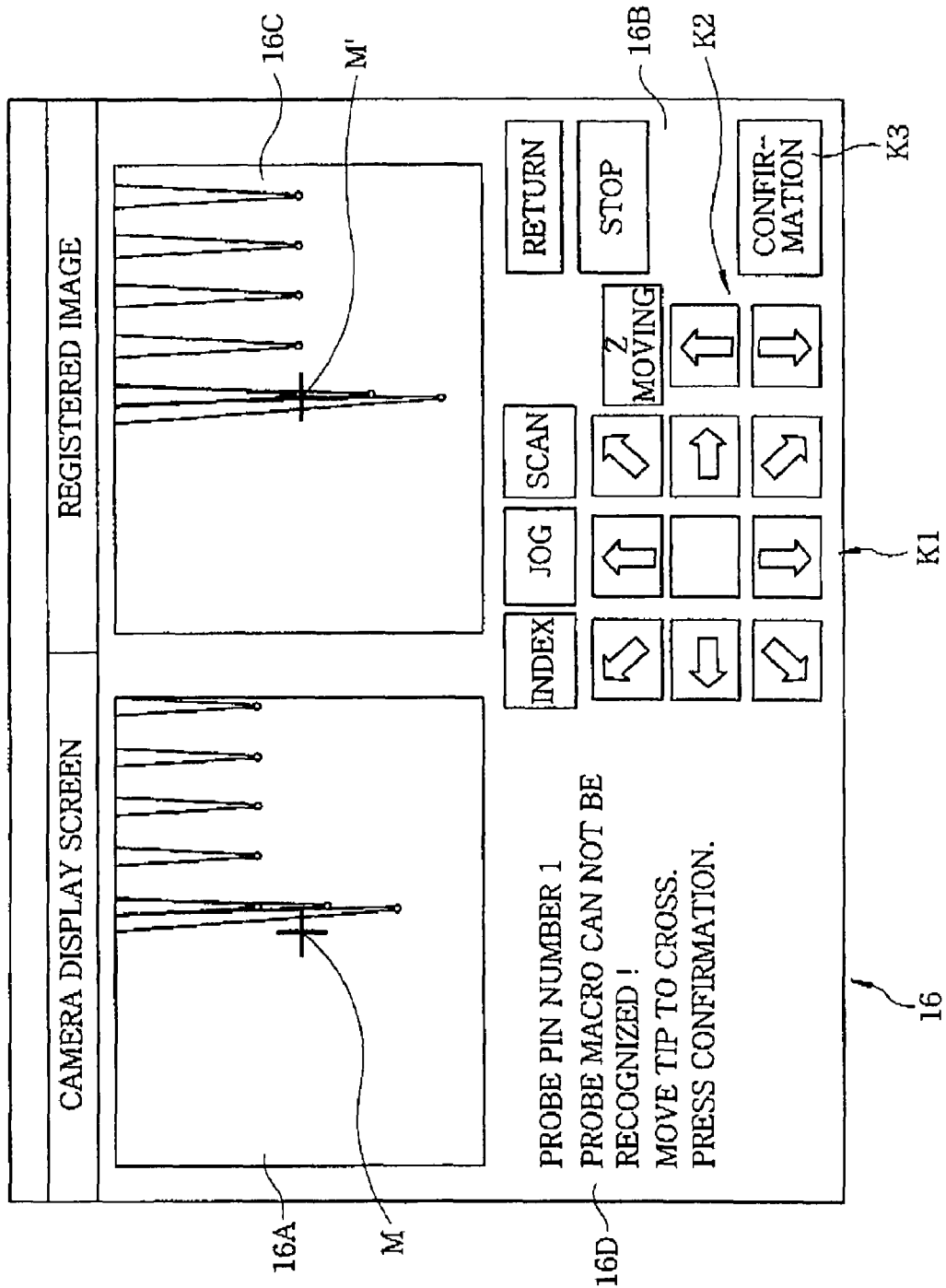
FIG. 3 illustrates a display screen that displays an assist supplement function executed during an alignment operation.

As illustrated in FIG. 3, when the assist supplement function is executed, four images are automatically displayed on the display screen 16. Displayed on an upper left part of the display screen 16 is the captured image 16A of the probes 12A having an alignment error in which an alignment mark M is misaligned with respect to a tip. Displayed on an upper right part of the display screen 16 is a registered image 16C corresponding to the captured image 16A. In the registered image 16C, an alignment mark M' is positioned on a specific tip. In addition, the manipulation panel 16B is displayed below the registered image 16C, and a current error state of the captured image 16A and instructions are displayed on a left side of the manipulation panel 16B in the form of character information 16D.

While monitoring the registered image 16C, the operator moves the captured image 16A by pressing the movement manipulation keys K1 of the manipulation panel 16B according to the instructions of the character information 16D. When the captured image 16A coincides with the registered image 16C, it is determined that the alignment error of the specific probe 12A has been solved and, hence, the operator presses a confirmation key K3 to disable the assist supplement function. Then, the assist function is automatically disabled and the alignment operation can be resumed and executed accurately. The registered images 16C are captured images of the tips of the probes 12A at the four corners of the probe card 12, which have been registered in the image storage unit 14B together with the position data and the photographing conditions at every probe registration operation.

Figure 4:
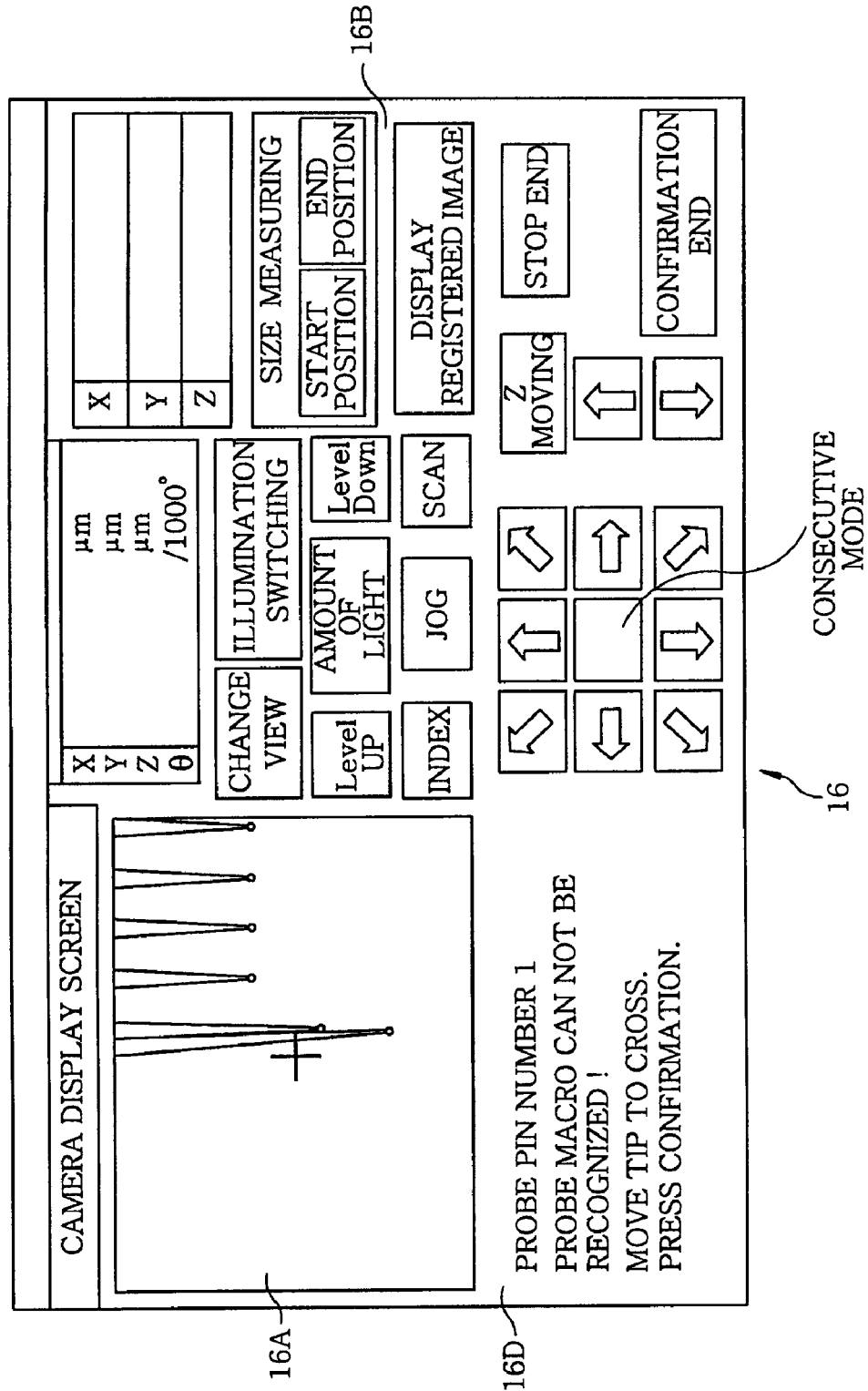
FIG. 4 shows a display screen that displays assist function executed during an alignment process in which the assist supplement function of FIG. 3 is not provided.
Figure 5A:
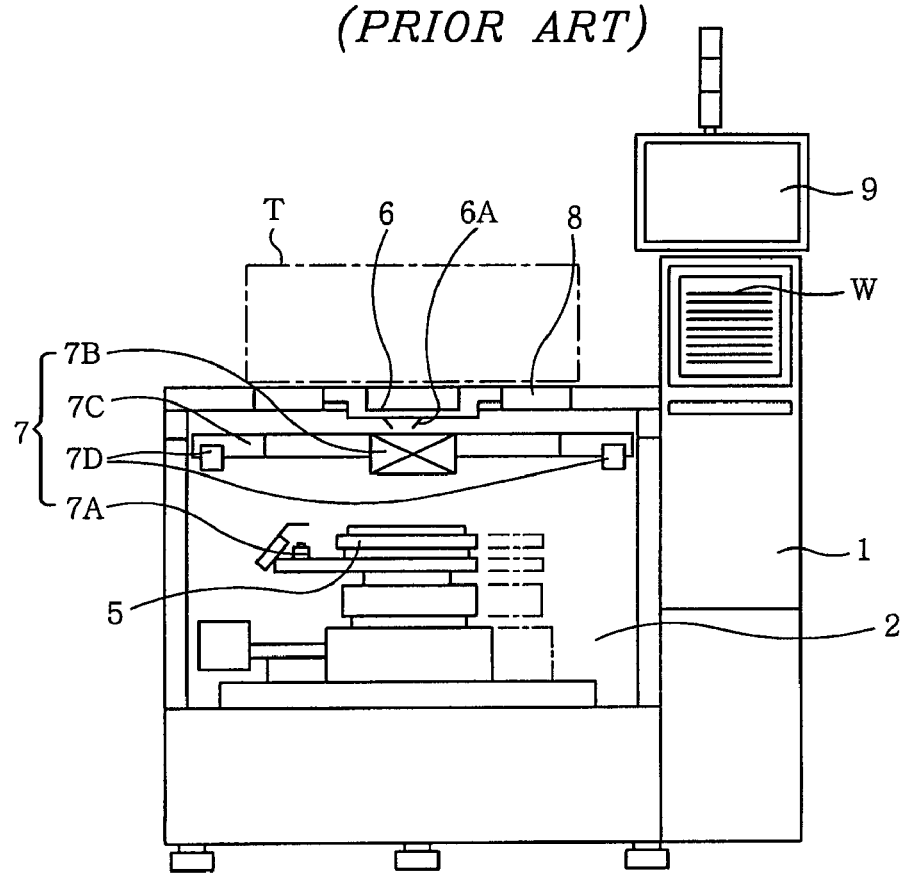
Figure 5B:
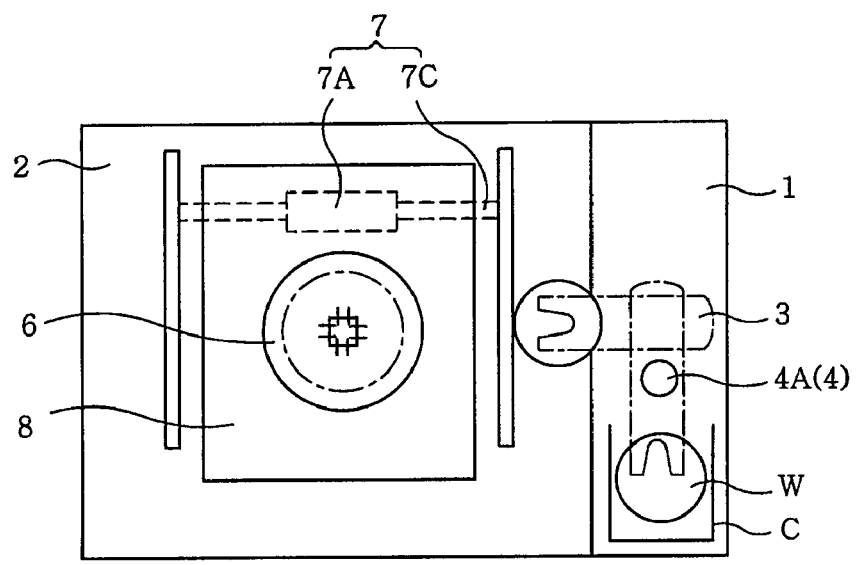

Meanwhile, in case of the conventional assist function having no assist supplement function, the captured image 16A in which the alignment mark M is misaligned with respect to the tip and the manipulation penal 16B are displayed as illustrated in FIG. 4. However, the registered image 16C corresponding to the captured image 16A is not displayed. In other words, when the conventional assist function is executed, only the captured image 16A is exclusively displayed on the display screen 16.

Therefore, it is difficult for the operator to determine which of the tips needs to be aligned with the alignment mark M to be released from the assist function. In order to terminate the assist function, it is required to accurately memorize the registered position or refer to a registration manual of the probe or the like and, hence, a long period of time is needed in resuming the alignment operation. If the alignment mark M is aligned with another tip different from the original tip when finishing the assist function, the alignment operation can not precisely performed, resulting in an inspection error.

As described above, in accordance with this embodiment, in case the probe card 12 is switched to another kind of probe card but is substantially a same device, the tips of probes 12A of the probe card 12 of a different kind are re-registered by following steps: automatically moving the first CCD camera 14 based on the previously registered position data of the first image information to thereby capture the images of the needle-tips of the probes 12A, respectively, corresponding to the first to the fourth macro points at a low magnification by using the first CCD camera 14; re-registering the captured images by reusing the photographing conditions of the first image information of the first to the fourth macro point; automatically moving the first CCD camera 14 based on the position data of the first image information of the first to the fourth macro point to thereby capture the images of the tips of the probes 12A corresponding to the first to the fourth micro point at a high magnification by using the first CCD camera 14; and re-registering the captured images by reusing the previously registered photographing conditions of the second image information of the first to the fourth micro point.

Accordingly, even if the captured images have changed by difference of kinds of the probes or contamination of tips of the probes 12A but the probes are substantially a same device, the changed captured images of the probes 12A can be re-registered in a considerably short period of time by reusing the previously registered photographing conditions and position data of the first and the second image information.

Besides, in accordance with this embodiment, it is possible to check on the display screen 16 whether or not the current captured image 16A of the probe 12A is identical with the registered image 16C corresponding thereto because the capture image 16A and the registered image 16C corresponding thereto are displayed simultaneously.

In addition, in accordance with this embodiment, the first CCD camera 14 is manipulated to move toward the alignment marks M and M' displayed on the captured images 16A of the probe 12A and the registered images corresponding thereto, respectively. Therefore, when the assist function is executed during the alignment of the wafer W and the probes 12A, the movement manipulation keys K1 and K2 of the manipulation penal 16B displayed on the display screen 16 are manipulated to move the first CCD camera 14 so that the captured image 16A can be aligned with the registered image 16C in a short period of time. As a consequence, it is possible to return to the alignment operation.

The present invention can be applied to various processing apparatuses, if necessary, without being limited to the above-described embodiments. Further, an object to be aligned can be applied to various objects such as a glass substrate and the like without being limited to a probe or a wafer. In the aforementioned embodiments, the images of the tips of the probes 12A are captured at different magnifications to thereby re-register the first and the second image information. However, they can also be re-registered without changing the magnification. In other words, the present invention further includes a method for re-registering at least one image information of an object to be aligned to thereby align the object by an imaging unit, the image information including photographing conditions and position data of the object which have been previously registered by capturing an image of the object with the imaging unit.

Specifically, the above method includes the steps of: automatically moving the object or the imaging unit based on the position data of the image information to thereby capture the image of the object with the imaging unit; and re-registering the captured image by reusing the photographing conditions of the image information.

The present invention can be appropriately used for a semiconductor manufacturing apparatus or an inspection apparatus.

While the invention has been shown and described with respect to the embodiments, it will be understood by those skilled in the art that various changes and modification may be made without departing from the scope of the invention as defined in the following claims.

What is claimed is:

1. A method for re-registering at least one set of first and at least one set of second image information of an object to be aligned to thereby align the object by an imaging unit, the first and second image information respectively including photographing conditions and position data of the object which have been previously registered by capturing an image of the object at a low and a high magnification with the imaging unit, the method comprising:

automatically moving at least one of the object and the imaging unit based on the position data of the first image information and re-capturing the image of the object at the low magnification with the imaging unit by using the previously registered photographing conditions of the first image information;

re-registering the first image information by using the image of the object re-captured at the low magnification;

automatically moving at least one of the object and the imaging unit based on the position data of the first image information and re-capturing the image of the object at the high magnification with the imaging unit by using the previously registered photographing conditions of the second image information; and re-registering the second image information by using the image of the object re-captured at the high magnification.

2. The method of claim 1, wherein if an alignment error occurs while aligning the object, the re-captured image of the object and an image for which photographing conditions and position data of the object have been previously registered are simultaneously displayed on a display screen.

3. The method of claim 2, wherein at least one of the object and the imaging unit is manipulated to move toward alignment marks displayed on the re-captured image and the image for which photographing conditions and position data of the object have been previously registered.

4. The method of claim 1, wherein the object is a probe card or an object to be inspected.

5. A storage medium for storing therein a computer-executable program for executing a method for re-registering at least one set of first and at least one set of second image information of an object to be aligned to align the object by an imaging unit, the image information including photographing conditions and position data of the object which have been previously registered by capturing an image of the object at a low and a high magnification with the imaging unit, the method comprising:

automatically moving at least one of the object and the imaging unit based on the position data of the first image information and re-capture the image of the object at the low magnification with the imaging unit by using the previously registered photographing conditions of the image information;

re-registering the first image information by using the re-captured image of the object;

automatically moving at least one of the object and the imaging unit based on the position data of the first image information and re-capture the image of the object at the high magnification with the imaging unit by using the previously registered photographing conditions of the image information; and re-registering the second image information by using the re-captured image of the object.

* * * * *